(12) United States Patent
Shinn et al.

(10) Patent No.: US 8,389,310 B2
(45) Date of Patent: Mar. 5, 2013

(54) METHOD FOR MANUFACTURING OXIDE THIN FILM TRANSISTOR AND METHOD FOR MANUFACTURING DISPLAY DEVICE

(75) Inventors: Ted-Hong Shinn, Hsinchu (TW); Henry Wang, Hsinchu (TW); Fang-An Shu, Hsinchu (TW); Yao-Chou Tsai, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 173 days.

(21) Appl. No.: 12/699,063

(22) Filed: Feb. 3, 2010

(65) Prior Publication Data

US 2011/0159618 A1 Jun. 30, 2011

(30) Foreign Application Priority Data

Dec. 28, 2009 (TW) .............................. 98145325 A

(51) Int. Cl.
*H01L 21/00* (2006.01)
*H01L 51/40* (2006.01)
(52) U.S. Cl. ..... 438/30; 438/99; 438/149; 257/E21.476; 257/E33.019
(58) Field of Classification Search .................... 438/30, 438/99, 149; 257/E33.019, E21.476
See application file for complete search history.

(56) References Cited

U.S. PATENT DOCUMENTS

| 6,929,889 | B2 * | 8/2005 | Belmont | 430/7 |
| 2006/0113536 | A1 * | 6/2006 | Kumomi et al. | 257/57 |
| 2006/0244107 | A1 * | 11/2006 | Sugihara et al. | 257/646 |

OTHER PUBLICATIONS

Furuta et al. "Oxygen bombardment effects on average crystallite size of sputter-deposited ZnO films" Journal of Non-Crystalline Solids 354 (2008) 1926-1931.*
IEEE Electron Device Letters 0741-3106/$25.00@2008 IEEE by Jang Yeon Kwon et al.
China Official Action issued on Jun. 13, 2012.

* cited by examiner

*Primary Examiner* — Leonard Chang
(74) *Attorney, Agent, or Firm* — Chun-Ming Shih

(57) ABSTRACT

A method for manufacturing an oxide thin film transistor includes the steps of forming an oxide semiconductor active layer by a deposition process. In the deposition process, a total flow rate of a gas is more than 100 standard cubic centimeters per minute and an electric power is in a range from 1.5 kilowatts to 10 kilowatts. The oxide thin film transistor manufactured by the above methods has advantages of low leakage currents, high electron mobility, and excellent temperature stability. The present invention also provides a method for manufacturing a display device. The display quality of the display device can be improved.

14 Claims, 4 Drawing Sheets

METHOD FOR MANUFACTURING OXIDE THIN FILM TRANSISTOR AND METHOD FOR MANUFACTURING DISPLAY DEVICE

This application claims the right of priority based on Taiwan Patent Application No. 098145325 entitled "Method for Manufacturing Oxide Thin Film Transistor and Method for Manufacturing Display Device", filed on Dec. 28, 2009, which is incorporated herein by reference and assigned to the assignee herein.

BACKGROUND

1. Field of the Invention

The present invention relates to a method for manufacturing a thin film transistor, and more particularly to a method for manufacturing an oxide thin film transistor and a method for manufacturing a thin film transistor display device.

2. Description of the Related Art

In these days, thin film transistor display devices, such as liquid crystal display devices, electrophoretic display devices and organic light emitting diode display devices, have been used more and more widely. To improve display quality of the display devices, people have always paid attention to research and development of structure and manufacturing method of a thin film transistor (TFT) that is one of core structure of the display device.

A conventional thin film transistor has an active layer made of amorphous silicon (a-Si). However, the conventional thin film transistor has some shortcomings, such as high leakage currents, low electron mobility and some of functions of integrated circuit incapable of forming on a substrate directly. Therefore, the conventional thin film transistor fails to satisfy the needs of high display quality of the display devices. For solving the above problems, low temperature polysilicon (LTPS) can be used to make the active layer. However, the process of making the low temperature polysilicon is complicated and has a low product yield, thus the low temperature polysilicon is still not easily to be used widely. Recently, an oxide thin film transistor appears, which has an active layer made of an oxide semiconductor, and can overcomes the above mentioned problems.

However, it is a new application that the oxide semiconductor is used for the active layer of the oxide thin film transistor. Therefore, some topics, such as, how to manufacture the oxide thin film transistor with good performances, are still in research stages.

What is needed, therefore, is a new method for manufacturing an oxide thin film transistor and a new method for manufacturing a display device that can overcome the above-mentioned shortcomings.

BRIEF SUMMARY

The present invention relates to a method for manufacturing an oxide thin film transistor, where the oxide thin film transistor has advantages of low leakage currents, high electron mobility and excellent temperature stability.

The present invention also relates to a method for manufacturing a display device that can improve display quality of the display device.

To achieve the above-mentioned advantage, the present invention provides a method for manufacturing an oxide thin film transistor. The method includes the steps of forming an oxide semiconductor active layer by a deposition process. In the deposition process, a total flow rate of a gas is more than 100 standard cubic centimeters per minute and an electric power is in a range from 1.5 kilowatts to 10 kilowatts.

In one embodiment, the deposition process is a sputtering deposition process. In one embodiment, material of the oxide semiconductor active layer is selected from the group consisting of zinc oxide, zinc tin oxide, chromium zinc oxide, gallium zinc oxide, titanium zinc oxide, indium gallium zinc oxide, copper aluminum oxide, strontium copper oxide, lanthanum copper oxide and any combination thereof. In one embodiment, a thickness of the oxide semiconductor active layer is in a range from 300 angstroms to 2000 angstroms. In one embodiment, the gas in the deposition process comprises oxygen and argon. In one embodiment, a flow ratio of oxygen to the total gas is in a range from 4% to 20%.

To achieve the above-mentioned advantage, the present invention also provides a method for manufacturing a display device. The method includes the following steps. Firstly, a substrate is provided. Secondly, an oxide thin film transistor array is formed on the substrate including the steps of forming an oxide semiconductor active layer by a deposition process. In the deposition process, a total flow rate of a gas is more than 100 standard cubic centimeters per minute and an electric power is in a range from 1.5 kilowatts to 10 kilowatts. Thirdly, a display layer is disposed on the oxide thin film transistor array.

In one embodiment, the method for manufacturing the display device further includes disposing a color filter on the display layer.

In one embodiment, the display layer is an electrophoretic display layer. The electrophoretic display layer can be a microcapsule electrophoretic display layer or a microcup electrophoretic display layer.

In one embodiment, the display layer is an organic light emitting diode display layer. The organic light emitting diode display layer can be bottom-emitting or top-emitting.

In one embodiment, the display layer is a liquid crystal display layer. A cell gap of the liquid crystal display layer can be in a range from 3 micrometers to 6 micrometers.

In the method for manufacturing the oxide thin film transistor and the method for manufacturing the display device of the present invention, the oxide semiconductor active layer is formed by the deposition process. In the deposition process, a total flow rate of a gas is more than 100 standard cubic centimeters per minute and an electric power is in the range from 1.5 kilowatts to 10 kilowatts, so that suitable plasma can be produced to deposit an oxide semiconductor. The oxide thin film transistor that is manufactured by the above methods has advantages of low leakage currents, high electron mobility, and excellent temperature stability. And thus, if the oxide thin film transistor is used in the display device, the display device can have an improved display quality.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

A display device includes a plurality of pixels. Structures of the pixels are substantially the same with each other; therefore, only one pixel would be shown illustratively to present the all pixels of the display device in the following drawings.

Figure 1:
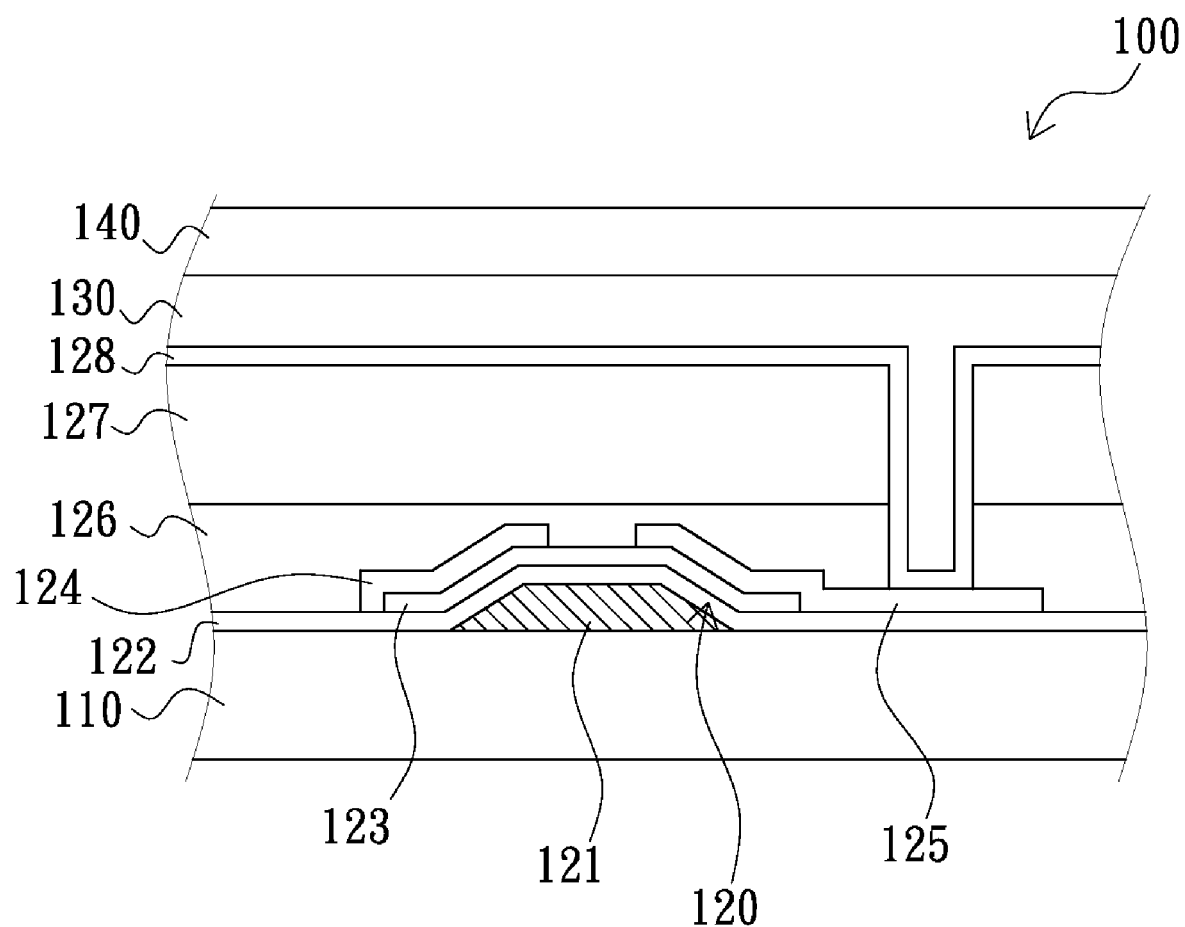
FIG. 1 is a schematic, side cross-sectional view of a display device according to a first embodiment of the present invention.

FIG. 1 is a schematic, side cross-sectional view of a display device according to a first embodiment of the present invention. Referring to FIG. 1, the display device 100 can be, but not limited to, an electrophoretic display device. In this embodiment, the display device 100 includes a substrate 110, an oxide thin film transistor array (not labeled) formed on the substrate 110 and a display layer 130 disposed on the oxide thin film transistor array. The oxide thin film transistor array can include a plurality of oxide thin film transistors 120, and only one of the oxide thin film transistors 120 is shown illustratively in FIG. 1.

A method for manufacturing the display device 100 would be described detailedly below. It should be noted that, the following description of the method for manufacturing the display device 100 is not limitation. For example, the various steps in the method may be arranged in a different sequence to achieve a similar effect.

Figure 2:
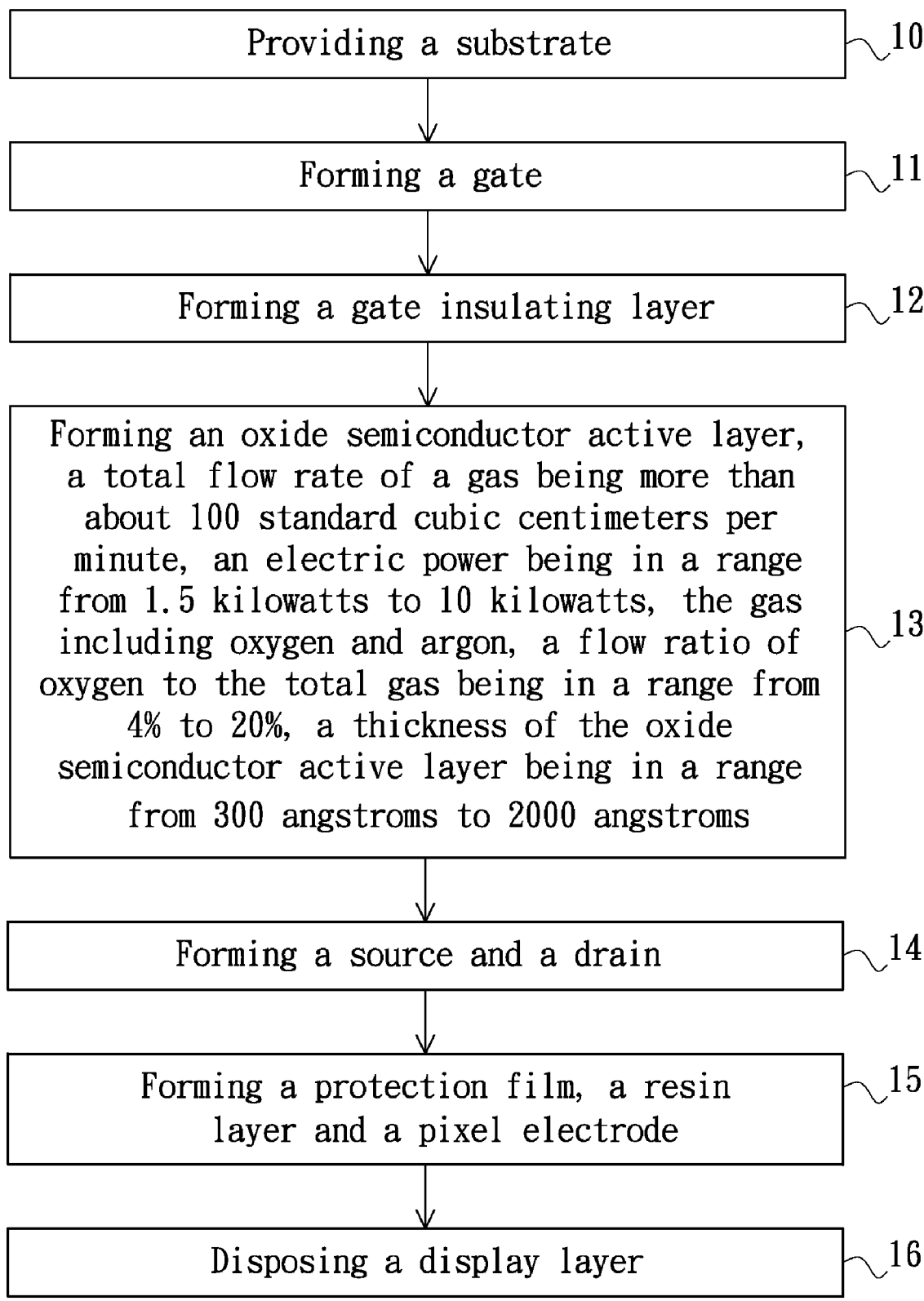
FIG. 2 is a flow chart of the method for manufacturing the display device of FIG. 1.

FIG. 2 is a flow chart of the method for manufacturing the display device 100 of FIG. 1. Referring to FIG. 2, firstly, at step 10, a substrate 110 is provided. The substrate 110 can be a transparent glass substrate or an acrylic substrate. In this embodiment, a surface of the substrate 110 is mainly used to form an oxide thin film transistor array thereon.

At steps 11 to 14, the oxide thin film transistor array is formed on the surface of the substrate 110. In detail, at step 11, a gate 121 is formed on the surface of the substrate 110. At step 12, a gate insulating layer 122 is formed on the gate 121, so as to cover the gate 121. At step 13, an oxide semiconductor active layer 123 is formed on the gate insulating layer 122 by a deposition process. At step 14, a source 124 and a drain 125 are formed on the gate insulating layer 122, and the source 124 and the drain 125 are electrically connected with the oxide semiconductor active layer 123 respectively. As such, the oxide thin film transistor 120 is made. Material of the oxide semiconductor active layer 123 can be selected from the group consisting of zinc oxide (ZnO), zinc tin oxide (ZnSnO), chromium oxide (CrSnO), gallium oxide (GaSnO), titanium oxide (TiSnO), indium gallium zinc oxide (InGaZnO, IGZO), copper aluminum oxide (CuAlO), strontium copper oxide (SrCuO), lanthanum copper oxysulfide (LaCuOS) and any suitable combination thereof. In this embodiment, the oxide semiconductor active layer 123 is made of indium gallium zinc oxide, and the following process of manufacturing the oxide semiconductor active layer 123 is described by taking indium gallium zinc oxide as an example.

In detail, when the oxide semiconductor active layer 123 is formed by the deposition process, a total flow rate of a gas can be more than 100 standard cubic centimeters per minute (sccm) and an electric power can be in a range from 1.5 kilowatts to 10 kilowatts, so that suitable plasma can be produced to deposit an oxide semiconductor. The gas can include oxygen ($O_2$) and argon (Ar). A flow ratio of oxygen to the total gas can be in a range from 4% to 20%. A thickness of the oxide semiconductor active layer 123 can be in a range from 300 angstroms to 2000 angstroms. In this embodiment, the oxide semiconductor active layer 123 can be, but not limited to, formed by a sputtering deposition process.

Referring to FIG. 2, after the source 124 and the drain 125 is formed, at step 15, a protection film 126 and a resin layer 127 can be formed on the source 124 and the drain 125, and a pixel electrode 128 can be formed to electrically connect to the drain 125.

In this embodiment, the oxide thin film transistor 120 is a bottom gate type. In an alternative embodiment, the oxide thin film transistor 120 can be a top gate type. Relative to the top bottom gate type, when the oxide thin film transistor 120 is the top gate type, an order of forming the various electrodes has a little difference, but the process of forming the oxide semiconductor active layer 123 is the same.

Referring to FIG. 2, at steps 16, a display layer 130 is disposed on the oxide thin film transistor array. In this embodiment, the display layer 130 is an electrophoretic display layer. The electrophoretic display layer can be a microcapsule electrophoretic display layer or a microcup electrophoretic display layer. In addition, a color filter (not shown) can further be disposed on the display layer 130, so that the display device 100 may achieve color display. It should be understood that, the method for manufacturing the display device 100 may further including disposing a protecting layer 140 to seal the display device 100, configuring an integrated circuit, and connecting to a printed circuit board (not shown).

Figure 3:
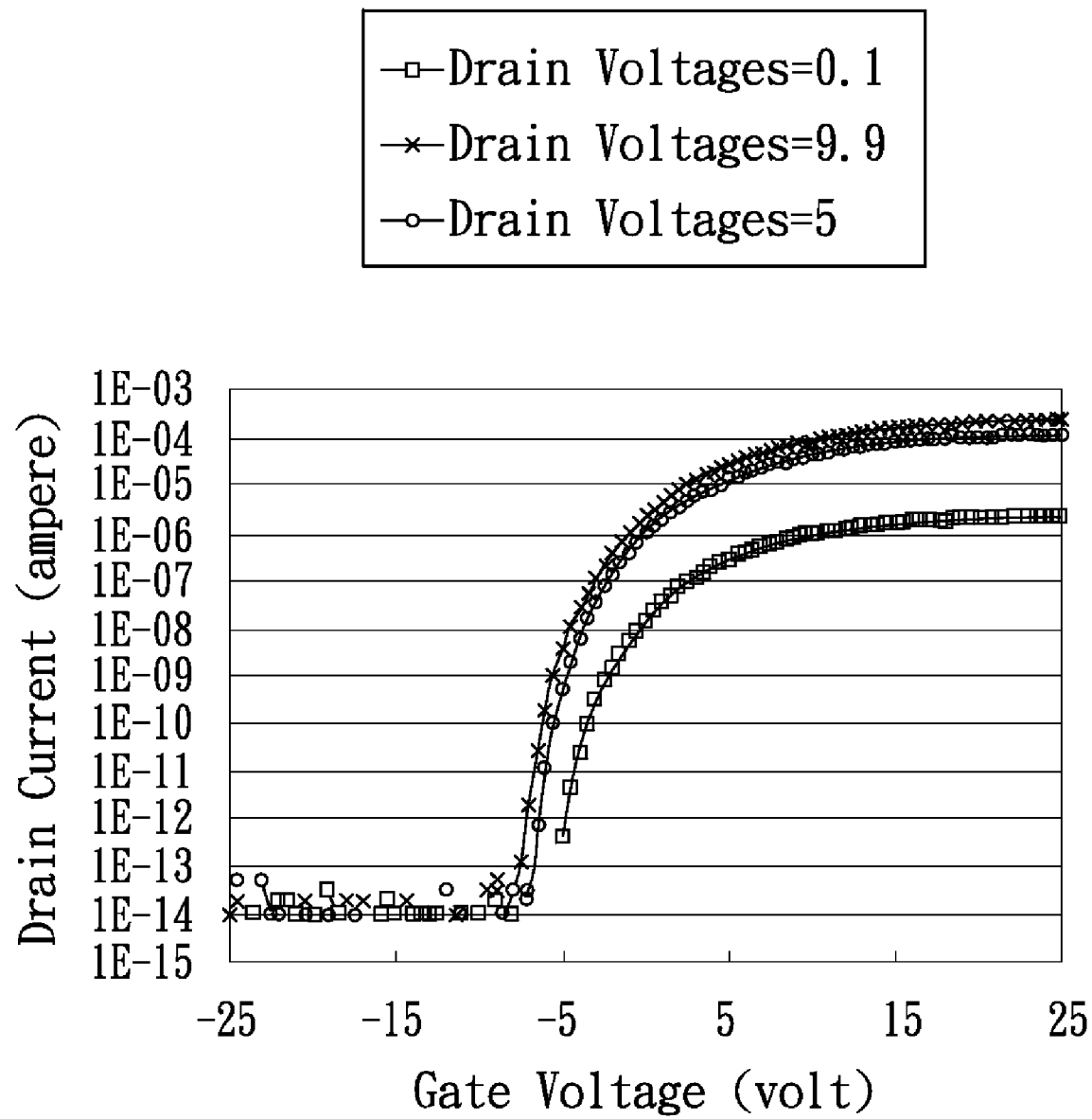
FIG. 3 is a curve graph of drain current and gate voltage of an oxide thin film transistor according to the present invention.

In this embodiment, the oxide semiconductor active layer 123 of the oxide thin film transistor 120 is formed by the deposition process. By controlling the conditions of deposition process, the oxide thin film transistor 120 with good performances can be obtained easily. FIG. 3 is a curve graph of drain current and gate voltage (Id-Vg) of the oxide thin film transistor 120, wherein, the drain voltages (Vd) are 0.1 volt (V), 9.9V and 5V respectively. The performances of the oxide thin film transistor 120 manufactured by the above methods can keep stability, after being heated at 200 Celsius degree for two hours. In other words, the reliability of the oxide thin film transistor 120 can not be influenced easily by temperature, and the oxide thin film transistor 120 has excellent temperature stability. In addition, leakage currents of the oxide thin film transistor 120 can be less than $10^{-14}$, and even if the oxide thin film transistor 120 is under sunlight or ultraviolet radiation, the leakage currents would still not increase. Electron mobility of the oxide thin film transistor 120 can be 2 square centimeters per volt per second ($cm^2$/V sec). Therefore, the oxide thin film transistor 120 has advantages of low leakage currents, high electron mobility, and excellent temperature stability. And thus, when the oxide thin film transistor 120 is used in the display device 100, the display device 100 can have an improved display quality.

Figure 4:
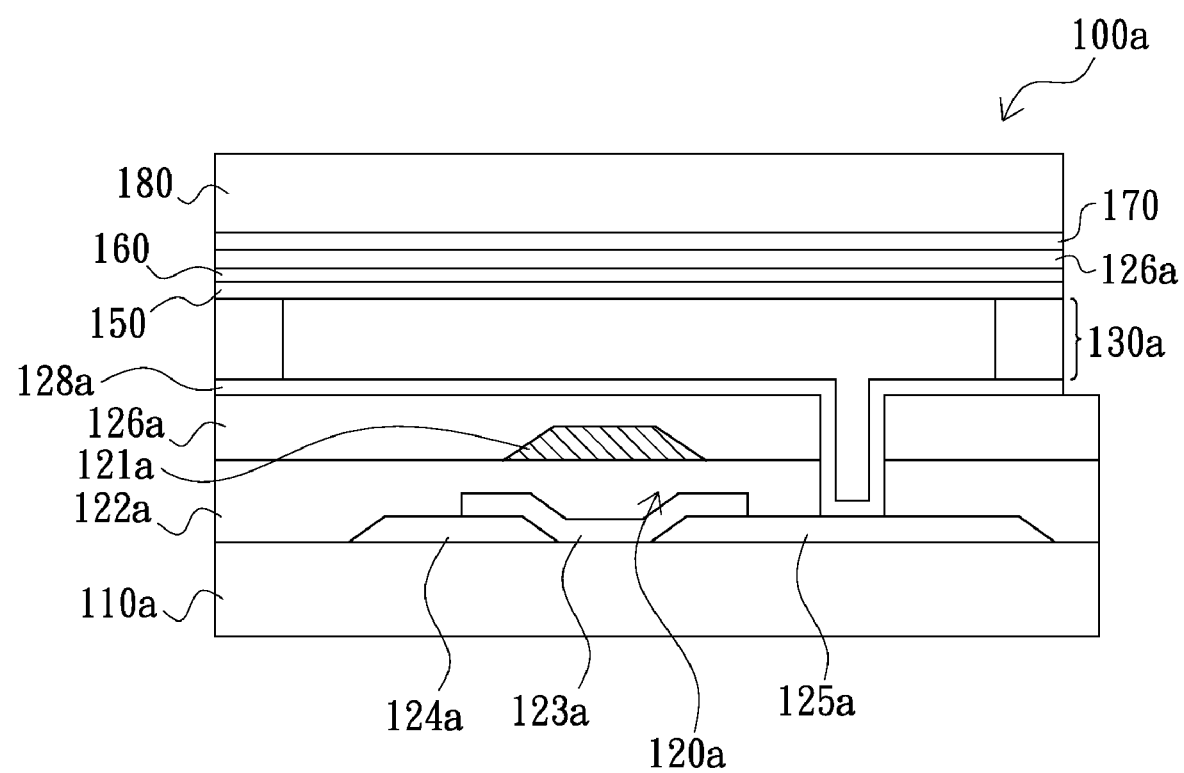
FIG. 4 is a schematic, side cross-sectional view of a display device according to a second embodiment of the present invention.

FIG. 4 is a schematic, side cross-sectional view of a display device according to a second embodiment of the present invention. Referring to FIG. 4, the display device 100a can be, but not limited to, a liquid crystal display device. In this embodiment, the method for manufacturing the display device 100a is similar to that of the method for manufacturing the display device 100 of the first embodiment. The difference is that an oxide thin film transistor 120a is a top gate type. A process of forming an oxide semiconductor active layer 123a can be the same to that of the oxide semiconductor active layer 123 of the oxide thin film transistor 120, but the order of forming the various layers in the oxide thin film transistor 120a has a little difference.

In detail, the oxide thin film transistor 120a is formed by the following steps. Firstly, a source 124a and a drain 125a are formed on a surface of the substrate 110a. Secondly, an oxide semiconductor active layer 123a is formed on the surface of the substrate 110a by a deposition process, and the oxide semiconductor active layer 123a is electrically connected with the source 124a and the drain 125a respectively. Thirdly, a gate insulating layer 122a is formed on the source 124a, the drain 125a and the oxide semiconductor active layer 123a, so as to cover the source 124a, the drain 125a and the oxide semiconductor active layer 123a. Fourthly, a gate 121a is formed on the gate insulating layer 122a, and corresponds to the oxide semiconductor active layer 123a. Fifthly, an insulation protection film 126a is formed on the gate 121a. As such, the oxide thin film transistor 120a is made.

It should be understood that, for manufacturing the display device 100a, a pixel electrode 128a should be formed to electrically connect to the drain 125a, and some other layers may be configured according to the requirement of the display device 100*a*. In particular, a display layer 130*a* of the display device 100*a* is a liquid crystal display layer, and a cell gap of the liquid crystal display layer can be in a range from 3 micrometers to 6 micrometers. Furthermore, a color filter substrate that includes an alignment film 150, a common electrode 160, a color filter layer 170, an insulation protection film 126*a* and an upper substrate 180 formed on the display layer 130*a* in the above mentioned order, is configured so as to make the display device 100*a* achieve display. In addition, for manufacturing the display device 100*a*, steps of configuring an integrated circuit (not shown) and connecting with the printed circuit board (not shown) may also be required.

It should be noted that, the display layer of the display device can be other display layers, such as an organic light emitting diode display layer. When the display layer is the organic light emitting diode display layer, the oxide thin film transistor can be a bottom gate type or a top gate type, and the method for manufacturing the display device should be modified properly. The organic light emitting diode display layer can be bottom-emitting or top-emitting.

In summary, in the method for manufacturing the oxide thin film transistor and the method for manufacturing the display device of the present invention, the oxide semiconductor active layer is formed by the deposition process. In the deposition process, a total flow rate of a gas is more than 100 standard cubic centimeters per minute and an electric power is in the range from 1.5 kilowatts to 10 kilowatts, so that suitable plasma can be produced to deposit an oxide semiconductor. The oxide thin film transistor that is manufactured by the above methods has low leakage currents, high electron mobility, and excellent temperature stability. And thus, when the oxide thin film transistor is used in the display device, the display device can have an improved display quality.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for manufacturing an oxide semiconductor active layer to reduce leakage currents to less than $10^{-14}$ A, increase electron mobility to 2 $cm^2/V$ sec and stabilize temperature stability thereof, comprising:
    forming the oxide semiconductor active layer with a thickness in a range from 660 angstroms to 2000 angstroms by a deposition process, and in the deposition process, a total flow rate of a gas being more than 100 standard cubic centimeters per minute and an electric power being in a range from 1.5 kilowatts to 10 kilowatts, the gas in the deposition process comprises an oxygen with a flow ratio to the total gas in a range from 4% to 20%.

2. The method for manufacturing the oxide semiconductor active layer as claimed in claim 1, wherein the deposition process is a sputtering deposition process.

3. The method for manufacturing the oxide semiconductor active layer as claimed in claim 1, wherein material of the oxide semiconductor active layer is selected from the group consisting of zinc oxide, zinc tin oxide, chromium tin oxide, gallium tin oxide, titanium tin oxide, indium gallium zinc oxide, copper aluminum oxide, strontium copper oxide, lanthanum copper oxysulfide and any combination thereof.

4. The method for manufacturing the oxide semiconductor active layer as claimed in claim 1, wherein the gas in the deposition process further comprises argon.

5. A method for manufacturing a display device, comprising:
    providing a substrate;
    forming an oxide thin film transistor array for reducing leakage currents to less than $10^{-14}$ A, increasing electron mobility to 2 $cm^2/V$ sec and stabilizing temperature stability thereof on the substrate including the steps of:
    forming an oxide semiconductor active layer with a thickness in a range from 660 angstroms to 2000 angstroms by a deposition process, and in the deposition process, a total flow rate of a gas being more than 100 standard cubic centimeters per minute and an electric power being in a range from 1.5 kilowatts to 10 kilowatts, the gas in the deposition process comprises an oxygen with a flow ratio to the total gas in a range from 4% to 20%; and
    disposing a display layer on the oxide thin film transistor array.

6. The method for manufacturing the display device as claimed in claim 5, wherein material of the oxide semiconductor active layer is selected from the group consisting of zinc oxide, zinc tin oxide, chromium tin oxide, gallium tin oxide, titanium tin oxide, indium gallium zinc oxide, copper aluminum oxide, strontium copper oxide, lanthanum copper oxysulfide and any combination thereof.

7. The method for manufacturing the display device as claimed in claim 5, wherein the gas in the deposition process further comprises argon.

8. The method for manufacturing the display device as claimed in claim 5, further comprising disposing a color filter on the display layer.

9. The method for manufacturing the display device as claimed in claim 5, wherein the display layer is an electrophoretic display layer.

10. The method for manufacturing the display device as claimed in claim 9, wherein the electrophoretic display layer is a microcapsule electrophoretic display layer or a microcup electrophoretic display layer.

11. The method for manufacturing the display device as claimed in claim 5, wherein the display layer is an organic light emitting diode display layer.

12. The method for manufacturing the display device as claimed in claim 11, wherein the organic light emitting diode display layer is bottom-emitting or top-emitting.

13. The method for manufacturing the display device as claimed in claim 5, wherein the display layer is a liquid crystal display layer.

14. The method for manufacturing the display device as claimed in claim 13, wherein a cell gap of the liquid crystal display layer is in a range from 3 micrometers to 6 micrometers.

* * * * *